US 8,448,834 B2

(12) United States Patent
Hattori et al.

(10) Patent No.: US 8,448,834 B2
(45) Date of Patent: May 28, 2013

(54) BOARD PRINTING SYSTEM

(75) Inventors: Tomohiko Hattori, Chiryu (JP); Hiroshi Tsuta, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 0 days.

(21) Appl. No.: 13/167,214

(22) Filed: Jun. 23, 2011

(65) Prior Publication Data

US 2012/0031952 A1 Feb. 9, 2012

(30) Foreign Application Priority Data

Aug. 3, 2010 (JP) ................. 2010-174479

(51) Int. Cl.
*B23Q 15/00* (2006.01)
*H05K 3/12* (2006.01)
*H05K 13/08* (2006.01)

(52) U.S. Cl.
CPC .............. *H05K 3/1216* (2013.01); *H05K 13/08* (2013.01)
USPC ................ 228/9; 228/33; 228/179.1

(58) Field of Classification Search
CPC .............. H05K 3/1216; H05K 13/08
USPC .............. 228/9, 33, 179.1
See application file for complete search history.

(56) References Cited

U.S. PATENT DOCUMENTS

2007/0130755 A1* 6/2007 Duquette et al. ............... 29/740
2010/0122633 A1* 5/2010 Doyle ........................ 101/126

FOREIGN PATENT DOCUMENTS

JP 2002-118360 4/2002
JP 2006-286989 10/2006

* cited by examiner

*Primary Examiner* — Nicholas P D'Aniello
(74) *Attorney, Agent, or Firm* — Oblon, Spivak, McClelland, Maier & Neustadt, L.L.P.

(57) ABSTRACT

A board printing system is provided with a printing apparatus for printing solder paste on each board, a printing inspection apparatus for inspecting a printed state of solder paste on each board, a transfer device for transferring each board in a forward direction from an unloading portion of the printing apparatus to a loading portion of the printing inspection apparatus, a reversible feed holding device configured to be able to hold a failure board which was taken out from the loading portion of the printing inspection apparatus as a result of being judged by the printing inspection apparatus to be rejected, after feeding the failure board in a reverse direction and then, to load the failure board to the loading portion of the printing inspection apparatus by feeding the failure board in the forward direction, and a selection device for enabling the transfer device and the reversible feed holding device to be used selectively.

8 Claims, 7 Drawing Sheets

Figure 1:
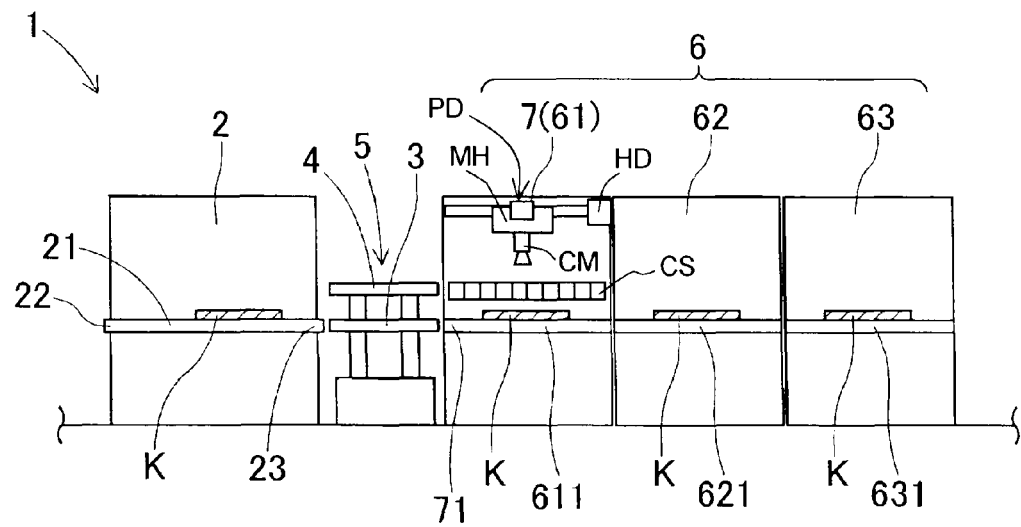

FIG. 5(A)
FIG. 5(B)
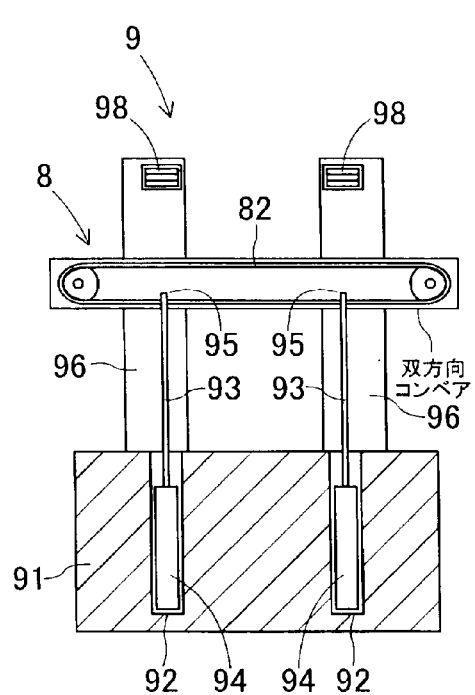
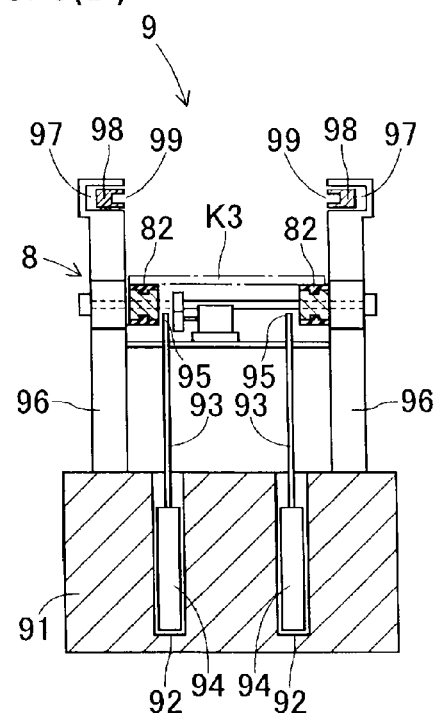

BOARD PRINTING SYSTEM

INCORPORATION BY REFERENCE

This application is based on and claims priority under 35 U.S.C. 119 with respect to Japanese patent application No. 2010-174479 filed on Aug. 3, 2010, the entire content of which is incorporated herein by reference.

BACKGROUND OF THE INVENTION

1. Field of the Invention

The present invention relates to a board printing system for printing solder paste on a board and for inspecting the printed state on the board.

2. Discussion of the Related Art

As equipment for producing boards each with a plurality of components mounted thereon, there are solder paste printing apparatus, component mounting apparatus, reflow apparatus and the like, and it is often the case that these apparatuses are connected by transfer devices to construct a board production line. Further, in order to inspect the printed state of solder paste on each board prior to mounting components in a component mounting apparatus, it has been conventional to provide a printing inspection apparatus of a stand-alone or dedicated type at a stage subsequent to the printing apparatus or to incorporate an inspection function in the printing apparatus. It has also been practiced to construct a component mounting line by arranging a plurality of component mounting apparatuses configured as modules in an in-line fashion and to make any printing inspection apparatus unnecessary by providing a component mounting apparatus at a forefront stage with an inspection function, thereby making the component mounting line a compact production line. As described above, the apparatuses which include a series of stages or steps to print solder paste on boards and to inspect the printed state of the boards can be grasped as a board printing system incorporated in the board production line.

Examples of the board printing system of this kind are disclosed in JP2006-286989 A (hereafter referred to as Patent Document 1) and JP2002-118360 A (hereafter referred to as Patent Document 2). The printing system in Patent Document 1 is provided with a printing apparatus and a board unloading device, and the printing apparatus is configured to switch a printing process interval per sheet of board in dependence on a lapse time after the cleaning of a printing member, while the board unloading device is configured to unload a post-printing board in harmonization with the processing timing at the next step. Further, as the next step, there is exemplified a construction that connects a printing inspection apparatus and a mounting apparatus in series. It is described therein that owing to a buffer function that the board transfer device performs in adjusting the unloading timing of the post-printing board, the tact time for the printing step and the next step can be adjusted.

Further, in a printing inspection method for cream solder disclosed in Patent Document 2, the printing is controlled to be discontinued when an abnormality at a printing step by the printing apparatus is detected. In Claim 2 of Patent Document 2, the occurrence of an abnormality is judged when the situation that a board is judged to have been printed incorrectly occurs more than a predetermined number of times. Further, Claim 7 of Patent Document 2 discloses a cream solder printing inspection apparatus which is provided with image pickup means, image processing means, image measuring means, abnormality judgment means and the like and which detects a printing abnormality based on image data to discontinue the printing operation. Further, in the description of an embodiment, there is disclosed a construction that a transfer device for the next step and an NG stocker for receiving each board at the occurrence of a printing abnormality are arranged at a stage subsequent to the printing inspection apparatus.

In board printing systems of this kind, it is difficult how to handle failure or rejected boards each of which is judge to be failure because of being not correct in the printed state. For example, in the printing system in Patent Document 1, the printing apparatus, the board transfer device, the printing inspection apparatus and the mounting apparatus are connected in series, and thus, when a rejected board is produced in the printing inspection apparatus, it is unavoidable that the production is discontinued to notify an operator as to the occurrence of the rejected board, so that the productivity goes down. If the rejected board were transferred together with corrected boards, it would be possible to continue the production. However, this would result in useless works because electronic components are mounted also on the rejected board.

In the printing inspection method and apparatus described in Patent Document 2, although the production can be continued until the NG stocker at the step subsequent to the printing inspection step receives rejected boards of a predetermined number of sheets, there is required an installation space for the NG stocker. Particularly, in a construction that an inspection function is incorporated in an electronic component mounting apparatus at a forefront stage of a modularized component mounting line, it is unavoidable to install the NG stocker between plural electronic component mounting apparatuses arranged in an in-line fashion. This results in spoiling the advantageous effects of the modularization, so that it becomes impossible to realize a production line which is compact in construction.

It is usual that the criterion for judging the printed state in a printing inspection apparatus is set strictly taking failsafe functions into consideration. Thus, it may be the case occasionally that even a rejected board which was judged to be rejected by the printing inspection apparatus can be used as a product through a correction judgment by the operator, and it also may be the case occasionally that such a rejected board can be used as a product by being given a minor reconditioning or correction by the operator. The correction in judgment or the reconditioning by the operator should be done within a limited time period in which printed solder paste still remain stable, and the board with which the correction judgment or reconditioning was made has to be returned into the production line. However, board production lines in the prior art have not been constructed to enable a board to be returned to the production line after being removed once therefrom. Thus, the operator has been required to take measures suited to the occasion such as, for example, temporarily stopping the board production line and then manually returning the board corrected in judgment or reconditioned to the board production line.

SUMMARY OF THE INVENTION

Accordingly, it is an object of the present invention to provide a board printing system capable of enhancing the productivity by continuing printings and inspections on other boards even when a failure board which is unacceptable in the printed state occurs, of making a board production line compact in construction and of heightening the yield of boards by reloading a board which was once taken out from a printing inspection apparatus.

Briefly, according to the present invention in a first aspect, there is provided a board printing system, which comprises a printing apparatus for printing solder paste on each of boards, a printing inspection apparatus for inspecting a printed state of solder paste on each of the boards, a transfer device for transferring each of the boards in a forward direction from an unloading portion of the printing apparatus to a loading portion of the printing inspection apparatus, a reversible feed holding device configured to be able to hold a failure board which was judged by the printing inspection apparatus to be rejected and which was taken out from the loading portion of the printing inspection apparatus, after feeding the failure board in a reverse direction and then, to load the failure board to the loading portion of the printing inspection apparatus by feeding the failure board in the forward direction, and a selection device for enabling the transfer device and the reversible feed holding device to be used selectively.

With the construction in the first aspect, the transfer device and the reversible feed holding device are provided between the printing apparatus and the printing inspection apparatus, and the selection device is configured to enable the transfer device and the reversible feed holding device to be used selectively. Thus, in a usual state, the transfer device is used to transfer each board with solder paste printed thereon in the printing apparatus to the printing inspection apparatus for inspection. Where a failure board is detected in the printing inspection apparatus, however, the reversible feed holding device is temporarily used instead of the transfer device to feed the failure board taken out from the printing inspection apparatus in the reverse direction and to hold the failure board thereon. Accordingly, it is possible without intervention by the operator to use the transfer device again in continuing the printings and inspections on other boards, so that the productivity can be enhanced.

According to the present invention in a second aspect, there is provided with a board printing system, which comprises a printing apparatus for printing solder paste on each of boards, a printing inspection apparatus for inspecting a printed state of solder paste on each of the boards, a bidirectional conveyor arranged between an unloading portion of the printing apparatus and a loading portion of the printing inspection apparatus and configured to be able to feed each of the boards in a forward direction and a reverse direction, a board lifter configured to lift up a failure board which was taken out from the printing inspection apparatus onto the bidirectional conveyor, from a conveyor transfer surface of the bidirectional conveyor and to hold the failure board at a lifted position, and a control device for controlling the bidirectional conveyor and the board lifter.

With the construction in the second aspect, the bidirectional conveyor is able to feed each of the boards in each of the forward and reverse directions between the unloading portion of the printing apparatus and the loading portion of the printing inspection apparatus, and the board lifter is able to lift up the failure board which was taken out from the printing inspection apparatus onto the bidirectional conveyor, from the conveyor transfer surface of the bidirectional conveyor and to hold the failure board at the lifted position. Therefore, where a failure board is detected in the printing inspection apparatus, the bidirectional conveyor feeds the failure board taken out from the printing inspection apparatus in the reverse direction, and the board lifter holds the failure board after lifting up the same from the conveyor transfer surface of the bidirectional conveyor. Accordingly, it is possible to use the bidirectional conveyor again for other boards without intervention by the operator, and hence, it can be realized to continue the printings and inspections on other boards, so that the productivity can be enhanced.

BRIEF DESCRIPTION OF THE ACCOMPANYING DRAWINGS

Figure 2A:
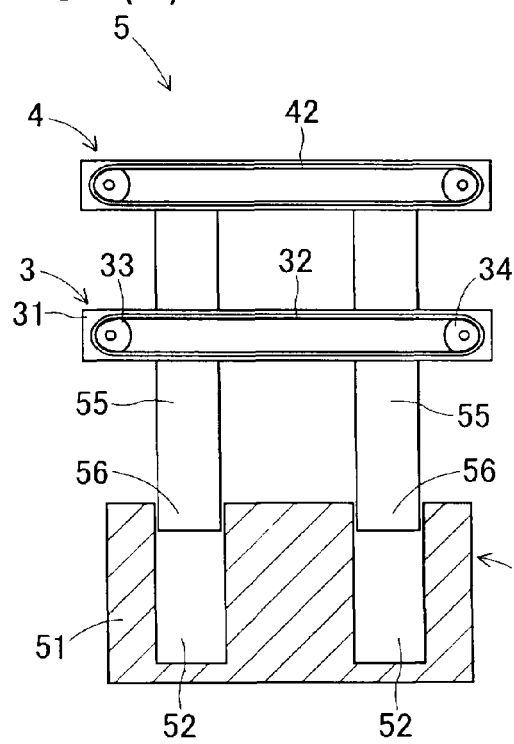
Figure 2B:
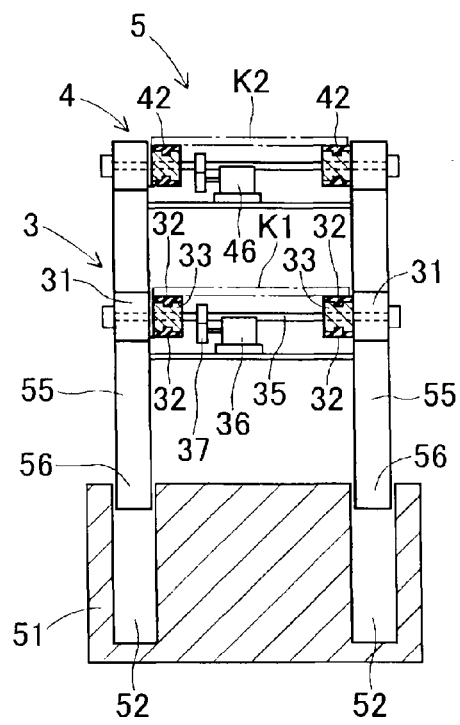
Figure 3A:
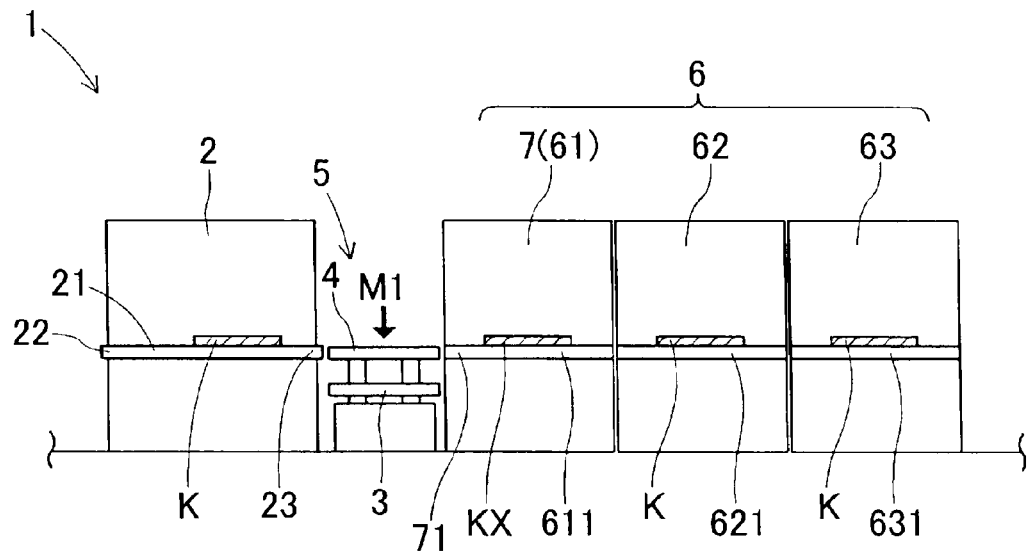
Figure 3B:
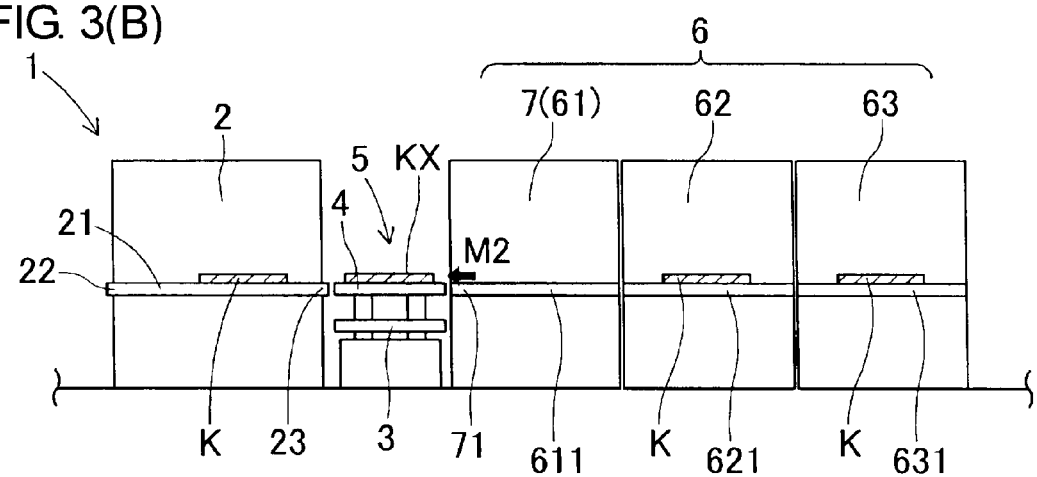
Figure 3C:
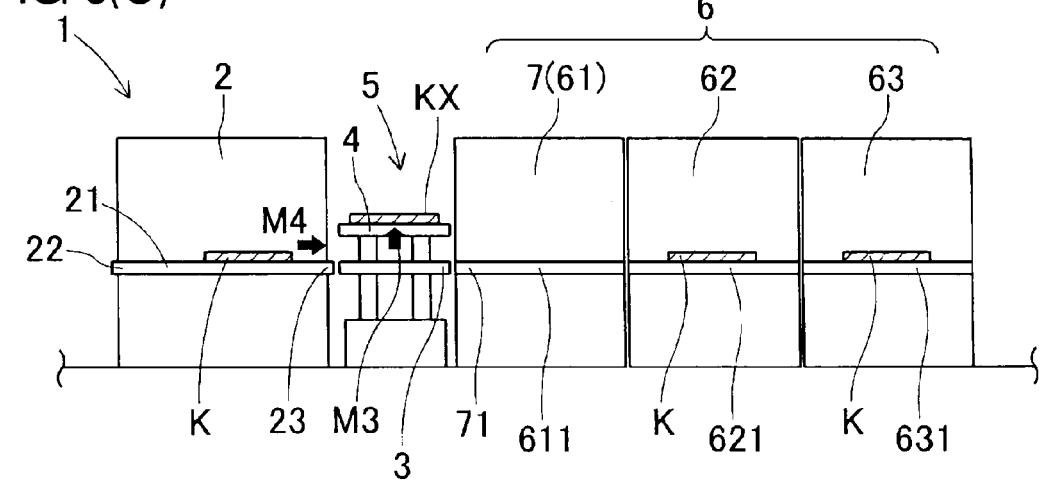
Figure 4A:
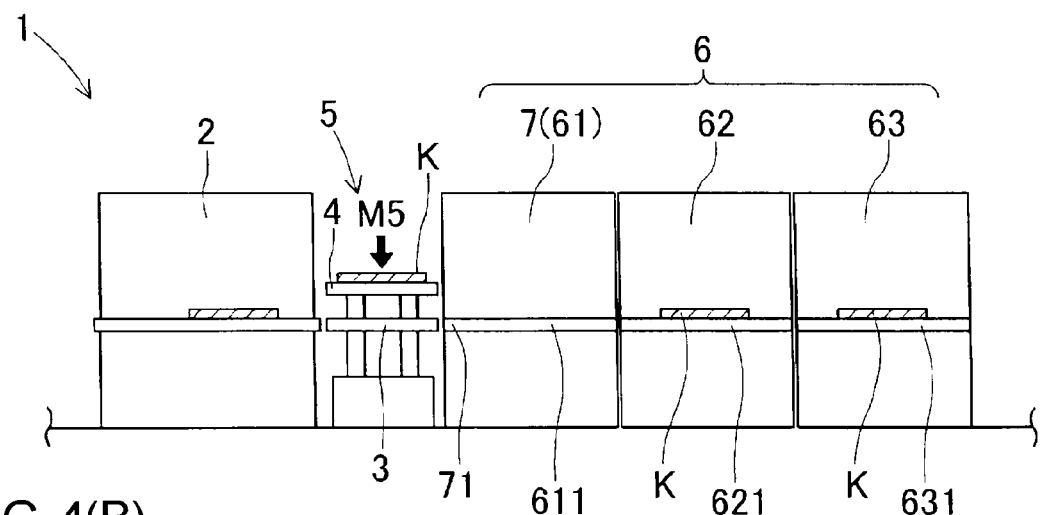
Figure 4B:
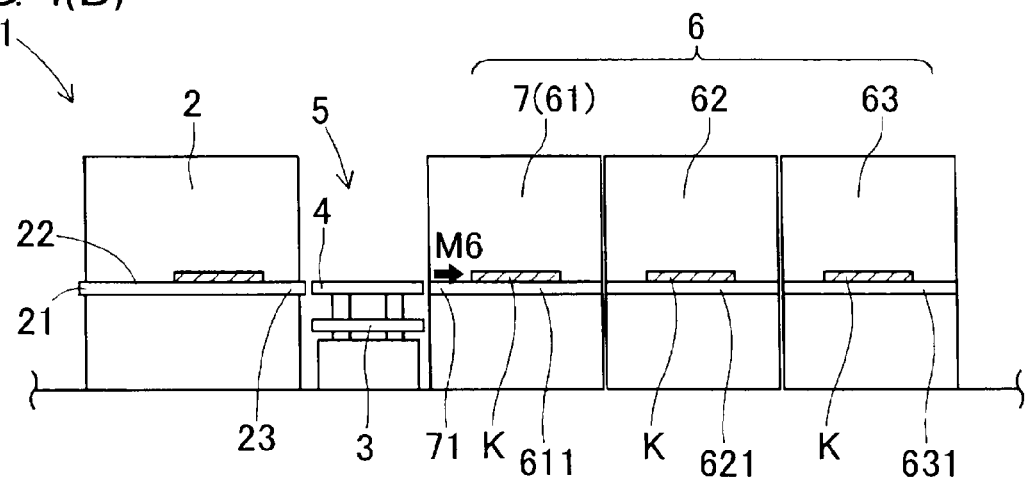
Figure 6A:
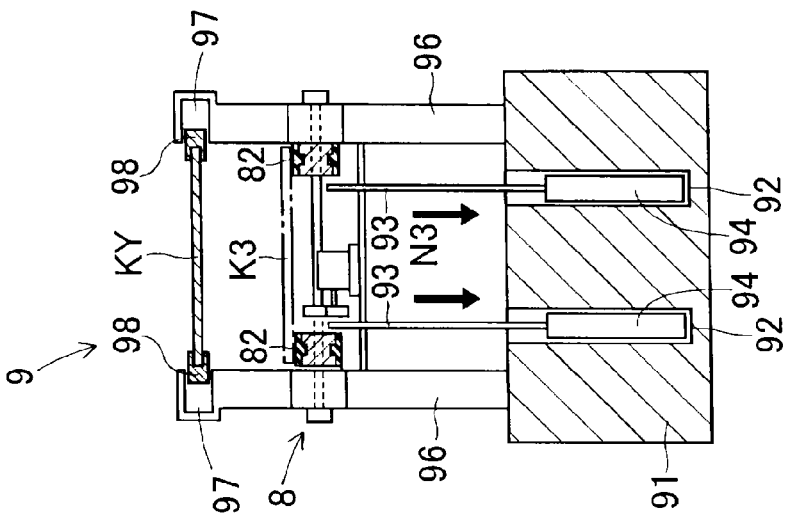
Figure 6B:
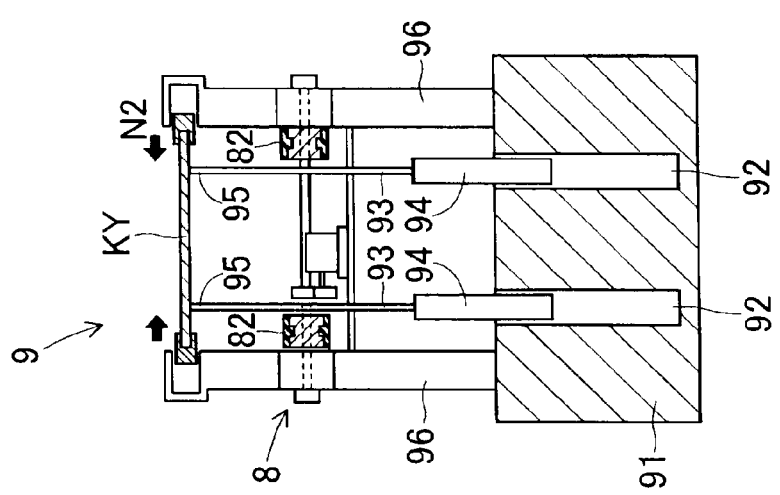
Figure 6C:
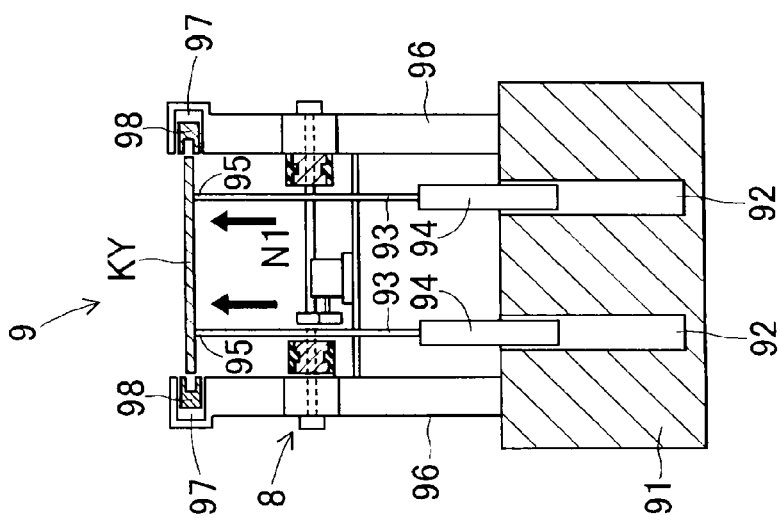
Figure 7:
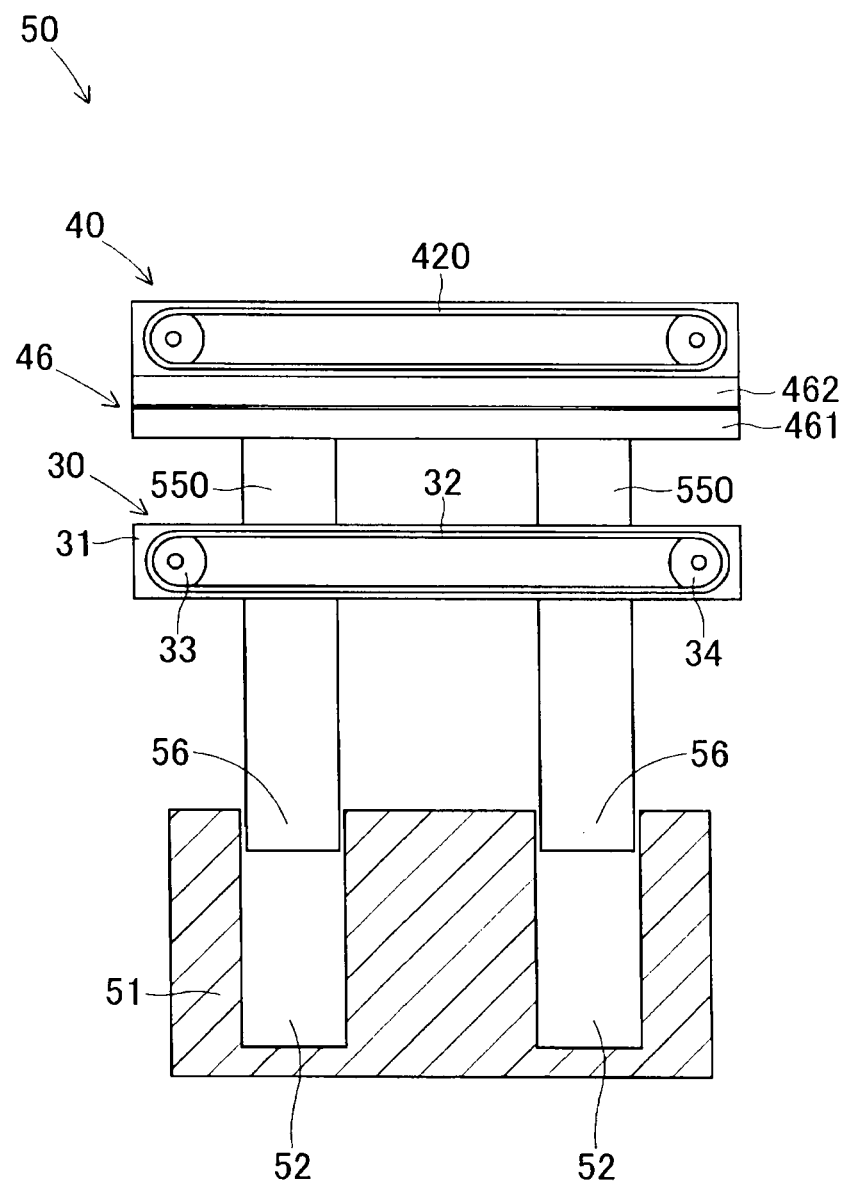
Figure 8A:
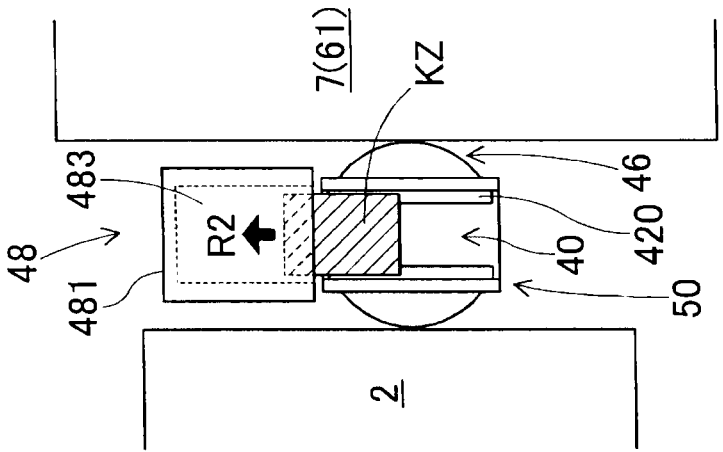
Figure 8B:
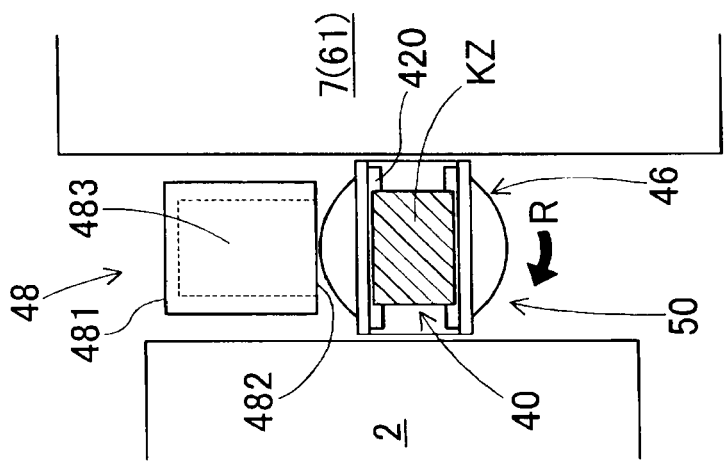

The foregoing and other objects and many of the attendant advantages of the present invention may readily be appreciated as the same becomes better understood by reference to the preferred embodiments of the present invention when considered in connection with the accompanying drawings, wherein like reference numerals designate the same or corresponding parts throughout several views, and in which:

FIG. 1 is a schematic view for explaining the entire construction of a board printing system in a first embodiment according to the present invention;

FIGS. 2(A) and 2(B) are schematic side and front views partly in section as viewed respectively from one side across a transfer direction and a front side in the transfer direction, both showing the construction of a conveyor lift device;

FIGS. 3(A) to 3(C) are explanatory views for explaining the progress of the operation that the board printing system in the first embodiment performs for a failure board;

FIGS. 4(A) and 4(B) are explanatory views for explaining the progress of the operation that a second transfer conveyor performs in reloading a board to a loading portion of a printing inspection apparatus;

FIGS. 5(A) and 5(B) are schematic side and front views partly in section as viewed respectively from one side across a transfer direction and a front side in the transfer direction, both showing the constructions of a bidirectional conveyor and a board lifter provided in a board printing system in a second embodiment according to the present invention;

FIGS. 6(A) to 6(C) are explanatory views for explaining the progress of the operations performed by the bidirectional conveyor and the board lifter as reversible feed holding means;

FIG. 7 is a schematic side view partly in section as viewed from one side across the transfer direction, showing the construction of a conveyor lift device in a third embodiment according to the present invention; and FIGS. 8(A) and 8(B) are plan views showing a board stocker provided in a board printing system in the third embodiment, wherein FIG. 8(A) shows a state that a failure board is held after being fed reversely and FIG. 8(B) shows another state that the failure board is in the course of being received in the board stocker.

DETAILED DESCRIPTION OF THE PREFERRED EMBODIMENTS

First Embodiment

Hereafter, a board printing system in a first embodiment according to the present invention will be described with reference to FIGS. 1 through 4(B). FIG. 1 is a schematic view for explaining the entire construction of a board printing system 1 in the first embodiment. The board printing system 1 is composed of a printing apparatus 2, a conveyor lift device 5, a printing inspection apparatus 7 incorporated in a first component mounting apparatus 61 which is installed at a forefront stage in a component mounting line 6. Usually, boards K are transferred from left toward right in FIG. 1 and are processed at respective stages such as printing, printing inspection and component mountings.

The printing apparatus 2 has a board transfer device 21 and a printing section (not shown). The printing apparatus 2 is an apparatus for printing solder paste on each board K (shown with hatching in the figure) which is transferred from a board supply apparatus (not shown) to a loading portion 22 of the board transfer device 21, and for unloading the printed board K from an unloading portion 23 of the board transfer device 21. Any one of well-known printing apparatuses of various kinds may be used as the printing apparatus 2.

The component mounting line 6 is constituted by three modularized first to third component mounting apparatuses 61-63 which are installed in an in-line fashion. The component mounting apparatuses 61-63 are installed with almost no space therebetween, so that it can be realized to make the board production line compact. The respective component mounting apparatuses 61-63 take similar constructions and are each composed of a board transfer device 611, 621 or 631, component supply devices CS and two component placing devices PD.

The board transfer device 611 of the first component mounting apparatus 61 is for loading each board K with solder paste printed by the printing apparatus 2 to position the board K at a mounting position thereon and for unloading the board K therefrom after component mountings on the board K. As schematically shown in FIG. 1, the component supply devices CS of the first component mounting apparatus 61 are for supplying components (preferably, electronic components though not limited to the same) to be mounted on boards K. As also schematically shown in FIG. 1, each of the two component placing devices PD in the first component mounting apparatus 61 is provided with a component mounting head MH for picking up components from one or both of the component supply devices CS to mount the components on solder paste printed on each board K and head drive mechanisms HD for driving component mounting head MH in at least two directions parallel to a surface (i.e., upper surface) of the board K held at the mounting position on the board transfer device 611, 621 or 631. Two component mounting heads MH are arranged at both sides with the board transfer device 611 located therebetween (i.e., both sides of the board transfer device 611 in a direction perpendicular to the drawing sheet of FIG. 1). The first component mounting apparatus 61 is an apparatus wherein the two heads MH face each other. Actually, one component placing device PD of the first component mounting apparatus 61 is diverted to the printing inspection apparatus 7 as referred to later, so that the other component placing device (not shown in FIG. 1) only performs component mountings in the first component mounting apparatus 61.

The board transfer device 621 of the second component mounting apparatus 62 is for loading each board K from the first component mounting apparatus 61 to position the board K at a mounting position and for unloading the board K with other components additionally mounted thereon. The board transfer device 631 of the third component mounting apparatus 63 is for loading each board K from the second component mounting apparatus 62 to position the board K at a mounting position and for unloading the board K with further components additionally mounted thereon. The component supply devices CS and the two component placing devices PD in each of the second and third component mounting apparatuses 62, 63 are similar in construction to those in the first component mounting apparatus 61, but differs in that both of the component placing devices perform component mountings in each of the second and third component mounting apparatuses 62, 63. The three component mounting apparatuses 61-63 take respective shares of components in kinds and numbers that each of them undertakes in mounting on each board K.

The printing inspection apparatus 7 is constructed in the component mounting apparatus 61 at the forefront stage of the component mounting line 6. Specifically, as shown in FIG. 1, an inspection camera CM is provided on the component mounting head MH of one component placing device PD in the component mounting apparatus 61 at the forefront stage. The inspection camera CM has a function of picking up a printed state of solder paste on each board K and of transmitting an image data to a control computer (not shown). The control computer compares the received image data with a judgment criteria which has been stored therein in advance, and makes an acceptance/rejection judgment as to the printed state of the solder paste on each board K. In the case of acceptance, the other component placing device (not shown in FIG. 1) in the component mounting apparatus 61 is then operated to mount components on the accepted board K. In the case of rejection, on the contrary, the board transfer device 611 is driven in a direction opposite to that at the ordinary time or situation (i.e., in the reverse direction), so that the rejected or failure board is taken out from the loading portion 71. It is to be noted that although not shown in the figures, the component supply devices CS and the two component placing devices PD each including the component mounting head MH, the head drive mechanisms HD and the like are provided in each of the second and third component mounting apparatuses 62, 63.

The conveyor lift device 5 is arranged between the unloading portion 23 of the printing apparatus 2 and the loading portion 71 of the printing inspection apparatus 7. The conveyor lift device 5 corresponds to a selection device in the claimed invention and also corresponds to a conveyor switching device. The conveyor lift device 5 vertically movably holds a second transfer conveyor 4 being a reversible feed holding device on an upper side and a first transfer conveyor 3 being a transfer device on the lower side. When the conveyor lift device 5 is lifted up, the first transfer conveyor 3 is selected to be located in alignment between the unloading portion 23 of the printing apparatus 2 and the loading portion 71 of the printing inspection apparatus 7. Accordingly, the first transfer conveyor 3 is able to feed each board K with the solder paste printed in the printing apparatus 2 in a forward direction and to transfer the board K to the printing inspection apparatus 7.

When the conveyor lift device 5 is moved down, the second transfer conveyor 4 is selected to be placed in alignment between the unloading portion 23 of the printing apparatus 2 and the loading portion 71 of the printing inspection apparatus 7. Accordingly, the second transfer conveyor 4 is able to feed reversely and hold each failure board which is taken out from the loading portion 71 as a result of being judged to be rejected by the printing inspection apparatus 7. Further, the second transfer conveyor 4 is configured to feed the board held thereon in the forward direction and to transfer the board again to the loading portion 71 of the printing inspection apparatus 7 in response to a command given by the operator. FIG. 1 shows a state that the board production makes good progress with boards K loaded to the printing apparatus 2, the printing inspection apparatus 7 (the component mounting apparatus 61 at the forefront stage) and the second and third component mounting apparatuses 62, 63.

FIGS. 2(A) and 2(B) are schematic views for explaining the construction of the conveyor lift device 5, wherein FIG. 2(A) is a side view partly in section as viewed from one side in a direction perpendicular to the transfer direction, whereas FIG. 2(B) is a front view partly in section as viewed from a front side in the transfer direction. FIGS. 2(A) and 2(B) illustrate the state that the first transfer conveyor 3 is selected as a result of the conveyor lift device 5 driven upward. As illustrated, the conveyor lift device 5 is composed of a base 51, four up-and-down legs 55 which are held by the base 51 movably up and down, and the like. Four cylinders 52 opening upward are formed in the base 51 taking about a box shape, at four corner portions of the base 51. Pistons 56 are formed at lower ends of the respective up-and-down legs 55, and the pistons 56 are respectively inserted into the cylinders 52. Pressurized air from a pressure source is supplied to or is discharged from the respective cylinders 52, so that the respective pistons 56 are slidden in the cylinders 52 and are moved up and down with the four up-and-down legs 55 synchronized with one another. The first transfer conveyor 3 is provided at a mid-height position of the up-and-down legs 55, while the second transfer conveyor 4 is provided at a top-height position of the up-and-down legs 55. The first transfer conveyor 3 and the second transfer conveyor 4 are similar in construction, and hence, the first transfer conveyor 3 will typically be described hereafter.

The first transfer conveyor 3 is composed of a pair of left and right conveyor belts 32, a drive motor 36 and the like. As shown in FIGS. 2(A) and 2(B), at the mid-height position of the up-and-down legs 55, a pair of guide rails 31 are arranged in parallel to the transfer direction. On inner sides of the pair of guide rails 31 facing each other, drive pulleys 33 are rotatably supported on one side closer to the printing apparatus 2, while guide pulleys 34 are freely rotatably supported on the other side closer to the printing inspection apparatus 7. Endless or loop conveyor belts 32 are would around the drive pulleys 33 and the guide pulleys 34. The left and right drive pulleys 33 are bodily coupled by a driven shaft 35 to be rotated bodily. The drive shaft 35 is rotationally driven by a rotation drive power outputted from the drive motor 36 through a reduction mechanism 37. Timing belts are used as the conveyor belts 32, while timing pulleys are used as the drive pulleys 33 and the guide pulleys 34.

With rotation of the drive motor 36, the conveyor belts 32 of the first transfer conveyor 3 are driven along a loop locus and transfers each board K1 (indicated by one-dot-chain line in FIG. 2(B)) with the same placed on transfer portions thereof extending straight between the drive pulleys 33 and the guide pulleys 34. The first transfer conveyor 3 may be configured as unidirectional conveyor for feeding each board K in the forward direction only. On the other hand, the second transfer conveyor 4 is configured as bidirectional conveyor wherein the rotational direction of the drive motor 46 is switchable in the forward and reverse directions, so that the conveyor belts 42 are switchable in feed direction to be able to feed each board K2 (indicated by one-dot-chain line in FIG. 2(B)) not only in the forward direction but also in the reverse direction.

Further, the conveyor lift device 5 is provided with a reloading or reentry command button (not shown) for use in inputting a command to load the board K2 held on the second transfer conveyor 4 again to the loading portion 71 of the printing inspection apparatus 7. That is, the construction is such that when the reentry command button is pressed by the operator, the conveyor lift device 5 is driven to go down to select the second transfer conveyor 4 and then, the second transfer conveyor 4 is driven in the forward direction so that the board K2 held thereon is loaded again. The up-and-down drive control of the conveyor lift device 5 and the operation controls of the first and second transfer conveyors 3, 4 are centralized in the control computer.

Next, description will be made regarding the operation, function and advantageous effects of the board printing system 1 in the first embodiment as constructed above. In the good production state shown in FIG. 1, the boards K are transferred in turn to the apparatuses at the subsequent stages. That is, the conveyor lift device 5 is driven to go up to select the first transfer conveyor 3, and a board K with solder paste printed thereon is fed to be transferred in the forward direction from the unloading portion 23 of the printing apparatus 2 to the loading portion 71 of the printing inspection apparatus 7. This transfer may be done on a pass operation basis that makes the board K go from the printing apparatus 2 directly to the printing inspection apparatus 7 without being stopped on the first transfer conveyor 3, or may be done on a buffer operation basis that temporarily stops the board K on the first transfer conveyor 3 to adjust the timing when the board is to be loaded to the printing inspection apparatus 7. Further, within the component mounting line 6, the respective component mounting apparatuses 61-63 are synchronized to transfer the boards K to respective subsequent stages, and the boards K are successively unloaded outside of the component mounting line 6 from the component mounting apparatus 63 at the last stage.

Next, description will be made regarding the case where a rejection or failure board KX is detected in the printing inspection apparatus 7 (the component mounting apparatus 61 at the forefront stage). FIGS. 3(A) to 3(C) are views for explaining the progress of the operation which is performed with the failure board KX in the board printing system 1 in the first embodiment. When the failure board KX takes place, as indicated by the arrow M1 in FIG. 3(A), the conveyor lift device 5 is driven to go down to select the second transfer conveyor 4, so that the unloading of the board K from the unloading portion 23 of the printing apparatus 2 is stopped temporarily. Then, the failure board KX is taken out from the loading portion 71 of the printing inspection apparatus 7 and, as indicated by the arrow M2 in FIG. 3(B), is fed reversely on the second transfer conveyor 4 to be held thereon. Then, as indicated by the arrow M3 in FIG. 3(C), the conveyor lift device 5 is driven to go up to select the first transfer conveyor 3, and as indicated by the arrow M4, the transfer of the board K from the printing apparatus 2 to the printing inspection apparatus 7 is resumed.

A series of the foregoing operations are automatically controlled by the control computer. Accordingly, even where the failure board KX is detected in the printing inspection apparatus 7, the printings and inspections on other boards K can be continued without intervention of the operator, so that the productivity can be enhanced.

Further, in the construction of the prior art, there is required a device corresponding to the first transfer conveyor 3 which transfers the boards K from the printing apparatus 2 to the printing inspection apparatus 7, and a space for installation of such a device enables the conveyor lift device 5 in the present embodiment to be installed. Thus, there is not required any additional space for installation of the conveyor lift device 5. Further, since the conveyor lift device 5 is installed between the printing apparatus 2 and the component mounting line 6, it is not required to incorporate any new device into the component mounting line 6 which has been oriented for compactification. By the combination of these two advantages, it becomes possible to make the board production line vary compact in construction.

Next, description will be made regarding the handling of the failure board KX. When the failure board KX takes place as shown in FIG. 3(A), the control computer so notifies the operator. Thus, the operator who ruses to the site is able to check the failure board KX on the second transfer conveyor 4 in the state shown in FIG. 3(C). Where as a result of such check, the judgment of the printing inspection apparatus 7 is adequate and the review by the operator also reaches the judgment of failure, the failure board KX is taken out, e.g., by hand from the second transfer conveyor 4. Thus, the good production state shown in FIG. 1 can be reproduced.

If the judgment of the printing inspection apparatus 7 is not adequate, specifically, where the failure notification is deemed to have resulted from an erroneous judgment because the operator's review results in nothing wrong on the failure board KX or where the degree of the fault is insignificant and is within a permissible margin of fault, the operator depresses the reentry command button. Further, also in the case where the degree of the fault is diminished to the permissible margin of fault as a result of a simple minor correction or reconditioning made by the operator, the operator depresses the reentry command button. As a consequence, the failure board KX turns to a board K which is qualified for inspection of the printed state.

FIGS. 4(A) and 4(B) are views for explaining the progress of the operation of the second transfer conveyor 4 (reversible feed holding device) in transferring the board K to the loading portion 71 of the printing inspection apparatus 7. Upon depression of the reentry command button, as indicated by the arrow M5 in FIG. 4(A), the conveyor lift device 5 is first driven to go down to select the second transfer conveyor 4, and thus, the unloading of the board K from the unloading portion 23 of the printing apparatus 2 is stopped temporarily. Then, as indicated by the arrow M6 in FIG. 4(B), the board K is fed forward on the second transfer conveyor 4 and is transferred again to the loading portion 71 of the printing inspection apparatus 7. Subsequently, the conveyor lift device 5 is driven to go up, whereby the good production state shown in FIG. 1 is restored.

As described above, in handing the failure board KX, the same is held on the second transfer conveyor 4 on the upper side, and thus, it is possible for the operator to check the printed state of solder paste by looking at the same directly, and it is also possible for the operator to easily carry out acceptance/rejection judgment, minor correction and the removal of the failure board KX from the production line 6.

Further, the case may occur that as a result of being loaded again, a board K which was once judged to be rejected is judged to be accepted at the printing inspection apparatus 7 and is usable as product. Therefore, it is possible to enhance the yield in the production of boards K. Further, various applications are possible such as giving a learning function of gradually enhancing the judgment criteria for the printing inspection apparatus 7 in light of the boards on which the operator made correction judgments to be acceptable, permitting the printing inspection apparatus 7 to unconditionally pass therethrough each board K which the operation judged to be acceptable, and the like.

Second Embodiment

Next, the construction of a board printing system in a second embodiment will be described with reference to FIGS. 5(A) and 5(B) mainly as to the respects which differ from the first embodiment. FIGS. 5(A) and 5(B) are schematic views for explaining a bidirectional conveyor 8 and a board lifter 9 provided in the board printing system in the second embodiment, wherein FIG. 5(A) is a side view partly in section as viewed from one side in a direction perpendicular to the transfer direction, and FIG. 5(B) is a front view partly in section as viewed from the front side in the transfer direction. The board printing system in the second embodiment is provided with the printing apparatus 2, the board mounting line 6 and the printing inspection apparatus 7 which are the same as those in the first embodiment, and differs therefrom in transfer means, reversible feed holding means and selection means. In the board printing system in the second embodiment, in place of the first and second transfer conveyors 3, 4 and the conveyor lift device 5 which are shown in FIGS. 2(A) and 2(B), the bidirectional conveyor 8 and the board lifter 9 shown in FIGS. 5(A) and 5(B) are installed at the same position.

The bidirectional conveyor 8 corresponds to the transfer means and is always placed in alignment between the unloading portion 23 of the printing apparatus 2 and the loading portion 71 of the printing inspection apparatus 7. The bidirectional conveyor 8 is the same in construction as each of the first and second transfer conveyors 3, 4 in the first embodiment and is able to feed each board K3 in any of forward and reverse directions by switching the moving direction of the conveyor belts 82.

The board lifter 9 has a function of lifting up the board K3 on the bidirectional conveyor 8 from a conveyor transfer surface and holding the board K3 and constitutes the reversible feed holding device in cooperation with the bidirectional conveyor 8. As shown in FIGS. 5(A) and 5(B), the board lifter 9 is composed of a base 91, four lifter pins 93 held on the base 91 to be movable up and down, holding members 98 at upper ends of four fixed legs 96 which are provided upright on the base 91, and the like. The four fixed legs 96 are provided upright at four corners on an upper surface of the base 91 taking a box shape. The aforementioned bidirectional conveyor 8 is provided at a mid-height position of the fixed legs 96. At upper portions of the fixed legs 95, holding cylinders 97 are horizontally formed on respective inner sides each facing one another. The holding members 98 each taking a U-shape in section are respectively received in the holding cylinders 97 to be slidable horizontally. Pressurized air is supplied to and discharged from the respective holding cylinders 97, and thus, the respective holding members 98 are synchronously slidden, so that recess or concave portions 99 of the holding members 98 pinch and hold four portions of each board K3.

Further, in the base 91 and at portions inside of the four fixed legs 96, four cylinders 92 opening upward are formed at four corners of an imaginary rectangle. Pistons 94 are formed at lower ends of the four lifter pins 93 and are respectively received in the cylinders 92. Thus, the lifter pins 93 are held on the base 91 to be movable up and down. Pressurized air from the pressurized air supply (not shown) is supplied to and discharged from the respective cylinders 92, so that the respective pistons 94 are slidden in the cylinders 92 to synchronously move the four lifter pins 93 up and down. FIGS. 5(A) and 5(B) illustrate the state that the lifter pins 93 are usually held at a lower position by being moved downward. Upper ends of the lifter pins 93 are located at inner sides of inner edges of the conveyor belts 82 of the bidirectional conveyor 8, and the height of the upper ends is set to be lower than the board K on the conveyor belts 82 when held at the lower position. In the course that the lifer pins 93 go up to a raised position, the upper ends 95 push up a lower surface of the board K3 to lift the board K from the conveyor transfer surface. At the raised position, the board K3 takes the same height as the foregoing holding members 98 for holding by the same.

A control computer (not shown) serves as a control device in the claimed invention and concentrically undertakes the operation control of the bidirectional conveyor 8, the up-and-down control of the lifter pins 93 and the holding control of the holding members 98.

Next, the operation and function of the board printing system in the second embodiment will be described with reference to FIGS. 6(A) to 6(C). FIGS. 6(A) to 6(C) are views for explaining the progress of the operations performed by the bidirectional conveyor 8 and the board lifter 9 which work as reversible feed holding means. In a good production state, the lifter pins 93 are held at the lower position, so that each board K3 is transferred by the bidirectional conveyor 8 in the forward direction. Upon occurrence of a rejection or failure board KY, the bidirectional conveyor 8 is first stopped, and the unloading of the board K3 from the unloading portion 23 of the printing apparatus 2 (see FIG. 1) is stopped temporarily. Then, the failure board KY is taken out from the loading portion 71 of the printing inspection apparatus 7, and the bidirectional conveyor 8 feeds the failure board KY to a position right above the lifter pins 94 in the reverse direction.

At this feed position, as shown in FIG. 6(A), pressurized air is supplied to the cylinders 92 to drive the lifter pins 93 upward as indicated by the arrow N1, and the failure board KY is lifted up to the same height as the holding members 98. Then, as indicated by the arrow N2 in FIG. 6(B), pressurized air is supplied to the holding cylinders 97 to drive the holding members 98, whereby the holding members 98 pinch the failure board KY at the concave portions 99 to hold the failure board KY at the position over the bidirectional conveyor 8. Finally, as indicated by the arrow N3 in FIG. 6(C), the pressurized air is discharged from the cylinders 92 to drive the lifter pins 93 downward, whereby the transfer of the board K3 by the bidirectional conveyor 8 is resumed.

The checking and the minor correction which the operator thereafter makes on the failure board KY are the same as those described in the foregoing first embodiment, and therefore, description of the checking and the minor correction will be omitted for brevity. Further, when the operator depresses the reentry command button, the board to be loaded again is transferred again to the loading portion 71 of the printing inspection apparatus 7 in the generally reverse order as the description was made with reference to FIGS. 6(A) to 6(C). Further, since the advantageous effects of the board printing system in the second embodiment are the same as those in the first embodiment, and therefore, description of the advantageous effects will be omitted for brevity.

Third Embodiment

Next, a board printing system in a third embodiment will be described with reference to FIG. 7 and FIGS. 8(A) and 8(B) mainly in the respects which differ from the first and second embodiments. The board printing system in the third embodiment is constructed by additionally providing the board printing system 1 in the first embodiment with a board stocker 48. FIG. 7 is a schematic side view partly in section as viewed from one side in a direction perpendicular to the transfer direction for explaining the construction of a conveyor lift device 50 in the third embodiment. As illustrated, in the third embodiment, the first transfer conveyor 30 is provided at a mid-height position of four up-and-down legs 550 which are movable up and down, and a round turntable 46 is provided at a top-height position. The turntable 46 is composed of a stationary section 461 secured to the up-and-down legs 550, a rotation section 462 being able to turn an angle of 90 degrees on the stationary section 461 and having a second transfer conveyor 40 on an upper side thereof, and a driving source (not shown) for rotationally driving the rotation section 462. FIG. 7 illustrates the state that the lift device 50 is driven to go up to select the first transfer conveyor 30. The board stocker 48 is installed on a lateral side of the conveyor lift device 50 which side is the underside of the drawing sheet of FIG. 7.

FIGS. 8(A) and 8(B) are plan views for explaining the board stocker 48 provided in the board printing system in the third embodiment, wherein FIG. 8(A) shown the state that a failure board KZ is fed in the reverse direction and is held on the turntable 46, and FIG. 8(B) shows the state that the failure board KZ is in the course of being received in the board stocker 48. The board stocker 48 is installed on the lateral side of the conveyor lift device 50 which is between the printing apparatus 2 and the printing inspection apparatus 7. The board stocker 48 is provided with a case 481 having an opening portion which opens toward the second transfer conveyor 40, and a plurality of board receiving shelves 483 which are movable up and down in the interior of the case 481. The board stocker 48 is configured to be able to receive failure boards KZ of the number corresponding to the board receiving shelves 483.

Next, description will be made regarding the operation, functions and advantageous effects of the board printing system in the third embodiment. In a good production state, the conveyor lift device 50 has been driven upward to select the first transfer conveyor 30, and each board with solder paste printed thereon is transferred in the forward direction from the unloading portion 23 of the printing apparatus 2 to the loading portion 71 of the printing inspection apparatus 7. Upon occurrence of a failure board KZ, the conveyor lift device 50 is driven to go down to select the second transfer conveyor 40, and the unloading of the board from the unloading portion 23 of the printing apparatus 2 (see FIG. 1) is stopped temporarily. Then, the failure board KZ (indicated by hatching in FIGS. 8(A) and 8(B)) is taken out from the loading portion 71 of the printing inspection apparatus 7, and is fed on the second transfer conveyor 40 in the reverse direction and is held on the second transfer conveyor 40, as shown in FIG. 8(A).

Subsequently, the turntable 46 is rotationally driven as indicated by the arrow R in FIG. 8(A), and the second transfer conveyor 40 is turned an angle of 90 degrees to face the opening portion 482 of the board stocker 48. On the board stocker 48 side, on one hand, a board receiving shelf which is vacant to receive a failure board KZ is moved vertically to adjust the height thereof. Then, the conveyor belts 420 of the second transfer conveyor 40 are driven in the reverse direction, whereby as indicated by the arrow R2 in FIG. 8(B), the failure board KZ is received in the vacant board receiving shelf 483 of the board stocker 48. Thereafter, the conveyor lift device 50 is driven upward to select the first transfer conveyor 30, and the transferring of the boards from the printing apparatus 2 to the printing inspection apparatus 7 are resumed.

A series of the aforementioned operations are automatically controlled by the control computer (not shown). Therefore, even where failure boards KZ are detected in the printing inspection apparatus 7, it is possible without intervention of the operator to continue the printings and inspections on other boards until the number in sheets of the failure boards KZ reaches the number of the board receiving shelves 483, and hence, it is possible to enhance the productivity in board production greatly.

It is a matter of course that in each of the foregoing embodiments, the printing inspection apparatus 7 which is configured in the component mounting apparatus 61 at the forefront stage of the component mounting line 6 may be an inspection apparatus of a stand-alone or dedicated type. Further, although the first embodiment uses the conveyor lift device 5 which has the second and first transfer conveyors 4, 3 vertically arranged, the selection means or device is not limited to the conveyor lift device 5. For example, there may be taken a construction that two transfer conveyors are arranged in parallel at even heights and that a conveyor switching device moves the two transfer conveyors in a direction perpendicular to the transfer direction for selection. Further, the third embodiment may be modified to make it possible to load each failure board KZ in the board stocker 48 again to the printing inspection apparatus 7.

Various features and many of the attendant advantages in the foregoing embodiment will be summarized as follows:

In the board printing system 1 in each of the first and third embodiments typically shown in FIGS. 1, 2(A), 2(B) and 7, the transfer device 3, 30 and the reversible feed holding device 4, 40 are provided between the printing apparatus 2 and the printing inspection apparatus 7, and the selection device (i.e., the conveyor lift device) 5, 50 is configured to enable the transfer device 3, 30 and the reversible feed holding device 4, 40 to be used selectively. Thus, in a usual state, the transfer device 3, 30 is used to transfer each board K with solder paste printed thereon from the printing apparatus 2 to the printing inspection apparatus 7 for inspection. Where a failure board K2 (KZ) is detected in the printing inspection apparatus 7, however, the reversible feed holding device 4, 40 is temporarily used instead of the transfer device 3, 30 to feed the failure board K2 (KZ) taken out from the printing inspection apparatus 7 in the reverse direction and to hold the failure board K2 (KZ). Accordingly, it is possible to use the transfer device 3, 30 again without intervention by the operator, and hence, it can be realized to continue the printings and inspections on other boards K, so that the productivity can be enhanced.

In the board printing system 1 in each of the first and third embodiments typically shown in FIGS. 1, 2(A), 2(B) and 7, the transfer device comprises the first transfer conveyor 3, 30, the reversible feed holding device comprises the second transfer conveyor 4, 40, and the selection device comprises the conveyor switching device 5, 50 which selectively brings the first transfer conveyor 3, 30 and the second transfer conveyor 4, 40 into alignment with the unloading portion 23 of the printing apparatus 2 and the loading portion 71 of the printing inspection apparatus 71. Accordingly, a large installation space is not required for the reverse feed holding device which feeds the failure board K2 (KZ) in the reverse direction and holds the same, so that it becomes possible to make the board production line compact in construction.

In the board printing system 1 in each of the first and third embodiments typically shown in FIGS. 2(A) and 7, the conveyor switching device comprises the conveyor lift device 5, 50 for vertically movably holding the second transfer conveyor 4, 40 provided on the upper side and the first transfer conveyor 3, 30 provided on the lower side. Thus, the failure board K2 (KZ) is held on the second transfer conveyor 4, 40 on the upper side, and this makes it possible easily for the operator to check the printed state, to make a small correction on the failure board K2 (KZ) and to take the failure board K2 (KZ) outside of the production line. In addition, there is not required an installation space exclusively used for the second transfer conveyor 4, 40 which corresponds to the reverse feed holding device, so that the board production line can be made to be further compact in construction.

In the board printing system 1 in each of the first and third embodiment typically shown in FIG. 1, the printing inspection apparatus 7 is constructed by providing the inspection camera CM on the component mounting head MH of the component placing device PD in the component mounting apparatus 61 at the forefront stage of the component mounting line 6. Thus, unlike the construction in the foregoing Patent Document 2 wherein an NG stocker is provided at a stage subsequent to a printing inspection apparatus, it is possible to install the reverse feed holding device 4, 40 between the printing apparatus 2 and the component mounting line 6. Accordingly, it is not required to incorporate a device corresponding to the NG stocker 48 in the component mounting line 6 oriented for a compact construction, so that the board production line can be made very compact in construction.

Further, in the board printing system 1 in the third embodiment typically shown in FIGS. 8(A) and 8(B), the reverse feed holding device 40 is provided with the board stocker 48 which is able to receive a plurality of failure boards KZ therein. Thus, even where a plurality of failure boards KZ are detected in the printing inspection apparatus 7, they can be received in the board stocker 48, so that the printings and inspections on other boards K can be continued, thereby enhancing the productivity greatly.

In the board printing system 1 in each of the first and third embodiments typically shown in FIGS. 1, 2(A) and 7, the reversible feed holding device 4, 40 loads at least one of a board with which judgment is corrected and a board with a small correction made thereon again to the loading portion 71 of the printing inspection apparatus 7 in response to a command given by the operator. Accordingly, without taking a measure to the situation arising, the operator is only required to give a command to load the board which was once taken out from the printing inspection apparatus 7, again to the same for use as product, whereby it becomes possible to enhance the yield greatly in the board production.

Also in the board printing system 1 in the second embodiment typically shown in FIGS. 1, 5(A) and 5(B), the bidirectional conveyor 8 is able to feed each of the boards in any of the forward and reverse directions between the unloading portion 23 of the printing apparatus 2 and the loading portion 71 of the printing inspection apparatus 7, and the board lifter 9 is able to lift up the failure board KY which was taken out from the printing inspection apparatus 7 onto the bidirectional conveyor 8, from the conveyor transfer surface of the bidirectional conveyor 8 and to hold the failure board at the lifted position. Therefore, where a failure board KY is detected in the printing inspection apparatus 7, the bidirectional conveyor 8 feeds the failure board KY taken out from the printing inspection apparatus 7 in the reverse direction, and the board lifter 9 holds the failure board KY after lifting up the same from the conveyor transfer surface of the bidirectional conveyor 8. Accordingly, it is possible to use the bidirectional conveyor 8 again without intervention by the operator, and hence, it can be realized to continue the printings and inspections on other boards K, so that the productivity can be enhanced.

Obviously, numerous further modifications and variations of the present invention are possible in light of the above teachings. It is therefore to be understood that within the scope of the appended claims, the present invention may be practiced otherwise than as specifically described herein.

What is claimed is:

1. A board printing system comprising:
   a printing apparatus that prints solder paste on each of boards, the printing apparatus including a first board transfer device;
   a printing inspection apparatus arranged on a downstream side in a transfer direction of the boards and spaced from the printing apparatus, the printing inspection apparatus inspecting a printed state of the solder paste on each of the boards, and the printing inspection apparatus being located so as to inspect the boards on a second board transfer device;
   a conveyor lift device provided as a check station for visual inspection between the printing apparatus and the printing inspection apparatus, which are respectively disposed on upstream and downstream sides of the conveyor lift device in the transfer direction of the boards, the conveyor lift device including
- a first transfer conveyor that transfers each of the boards in a forward direction from an unloading portion of the first board transfer device of the printing apparatus to a loading portion of the second board transfer device;
- a reversible feed second transfer conveyor that takes out a failure board which was judged by the printing inspection apparatus to be rejected, in a reverse direction from the loading portion of the second board transfer device, the reversible feed second transfer conveyor holding the failure board thereon for a visual inspection by an operator, and the reversible feed second transfer conveyor transferring the failure board thereon to the loading portion of the second board transfer device after the visual inspection by the operator; and
- a selection device that positions the conveyor lift device selectively in a first position and a second position, wherein, in the first position,
- the first transfer conveyor is in alignment with a transfer path that extends between the unloading portion of the first board transfer device of the printing apparatus and the loading portion of the second board transfer device, the first transfer conveyor disposed such that a first end of the first transfer conveyor is aligned with the unloading portion of the first board transfer device of the printing apparatus and a second end of the first transfer conveyor is aligned with the loading portion of the second board transfer device, and
- the reversible feed second transfer conveyor is out of alignment with the transfer path and is ready for the visual inspection by the operator of the failure board on the reversible feed second transfer device, and wherein, in the second position, the conveyor lift device is vertically lowered, such that
- the first transfer conveyor is out of the alignment with the transfer path, and
- the reversible feed second transfer conveyor is in alignment with the transfer path such that a first end of the reversible feed second transfer conveyor is aligned with the unloading portion of the first board transfer device of the printing apparatus and a second end of the reversible feed second transfer conveyor is aligned with the loading portion of the second board transfer device of the printing inspection apparatus.

2. The board printing system as set forth in claim 1, further comprising a component mounting line provided at a stage subsequent to the conveyor lift device, the component mounting line including a plurality of component mounting apparatuses arranged in an in-line fashion each of which includes:
- a mounting line board transfer device that transfers each board with the solder paste printed thereon and that positions each board on a mounting position thereon, one of the mounting line board transfer devices corresponding to the second board transfer device;
- a component supply device that supplies components; and
- a component placing device including
    - a component mounting head that successively picks up components from the component supply device to mount the components on the solder paste printed on each of the boards, and
    - a head drive mechanism for driving the component mounting head in at least two directions parallel to a surface on the board held on the mounting line board transfer device, wherein the printing inspection apparatus includes an inspection camera on the component mounting head of the component placing device of the component mounting apparatus at a forefront stage in the component mounting line.

3. The board printing system as set forth in claim 1, wherein the reversible feed second transfer conveyor includes a board stocker provided between the printing apparatus and the printing inspection apparatus that receives a plurality of failure boards therein from the reversible feed second transfer conveyor.

4. The board printing system as set forth in claim 2, wherein the inspection camera detects a printed state of the solder paste on each of the boards and transmits image data for comparison with judgment criteria.

5. The board printing system as set forth in claim 1, further comprising a reentry command button that, when actuated, causes the conveyor lift device to be vertically lowered to the second position.

6. The board printing system as set forth in claim 1, further comprising a control computer that notifies the operator of a need for a visual inspection.

7. The board printing system as set forth in claim 1, further comprising a control computer that has a learning function which determines whether to unconditionally pass a board after the printing inspection apparatus inspects a printed state of the solder paste on the board, the learning function being based on feedback from the operator after the visual inspection of an automatically failed board.

8. The board printing system as set forth in claim 1, wherein the conveyor lift device is unenclosed so as to permit open access for the visual inspection by the operator.

* * * * *